United States Patent
Mok et al.

(10) Patent No.: US 6,710,609 B2
(45) Date of Patent: Mar. 23, 2004

(54) MOSAIC DECAL PROBE

(75) Inventors: Sammy Mok, Cupertino, CA (US); Fu Chiung Chong, Saratoga, CA (US); Ira Feldman, Los Altos, CA (US)

(73) Assignee: NanoNexus, Inc., San Jose, CA (US)

( * ) Notice: Subject to any disclaimer, the term of this patent is extended or adjusted under 35 U.S.C. 154(b) by 0 days.

(21) Appl. No.: 10/196,494

(22) Filed: Jul. 15, 2002

(65) Prior Publication Data

US 2004/0008045 A1 Jan. 15, 2004

(51) Int. Cl.$^7$ .............................................. G01R 31/02
(52) U.S. Cl. ........................ 324/754; 324/72.5; 324/765
(58) Field of Search ................................ 324/754, 755, 324/758, 765, 760, 763, 72.5, 158.1; 438/14, 106, 459, 15, 16

(56) References Cited

U.S. PATENT DOCUMENTS 5,600,257 A * 2/1997 Leas et al. ................... 324/754
5,977,787 A * 11/1999 Das et al. .................... 324/761

\* cited by examiner

*Primary Examiner*—Kamand Cuneo
*Assistant Examiner*—Trung Q Nguyen
(74) *Attorney, Agent, or Firm*—Glenn Patent Group; Michael A. Glenn

(57) ABSTRACT

The invention provides a mosaic decal probe, in which a mosaic of probe chips is assembled into a thin membrane that is suspended in a ring which is made of a material that has a TCE matching that of silicon. The membrane is mounted on the ring in tension, such as it stays in tension throughout a functional temperature range. In this way, the membrane exhibits a functional TCE matching that of the ring. The probe chip preferably has spring contacts on both sides. Apertures are cut in the membrane to allow the spring contacts on one side of the membrane to protrude through the membrane and contact the printed wiring board. The spring contacts which contact the printed wiring board are allowed to slide during temperature excursions, thereby decoupling the TCE mismatch between the probe chip and the printed wiring board. Two preferred embodiments are currently contemplated. A first embodiment of the invention uses a low-count mosaic comprised of few probe chips, for example four probe chips. The probe chips have the same TCE as the wafer under test, e.g. silicon. In this embodiment, the probe chip is peripherally attached to the membrane. A second embodiment of the invention provides a high-count mosaic, using a high number of probe chips, for example nine or more probe chips. In this embodiment, the probe chips are smaller and can have a slight TCE difference from that of the test wafer, e.g. silicon. For example, the probe chips may be made out of a ceramic material. This embodiment of the invention uses a center attachment to secure the probe chips to the membrane.

10 Claims, 9 Drawing Sheets

*After Saw*

*6.6" Square Silicon Substrate*

Sawed Substrate

4" Ceramic Wafer

MOSAIC DECAL PROBE

BACKGROUND OF THE INVENTION

1. Technical Field

The invention relates to the testing of semiconductor devices. More particularly, the invention relates to having the capability to simultaneous probe of all devices on semiconductor wafers in connection with device testing and burn-in.

2. Description of the Prior Art

In semiconductor device manufacturing, increased device densities, additional throughput, and higher device yields are desirable. Typically, wafer prober cards are used in wafer probers and are stepped across a wafer to test individual devices. As integrated circuits (ICs) become more complex the test times are increasing and so is the-cost of test. To this end, it is therefore advantageous to simultaneously probe all the active product devices on semiconductor wafers at the wafer level in connection with device testing and burn-in. This is particularly true in connection with the fabrication of 200 and 300 mm wafers.

One problem in full wafer-level device testing and burn-in has to do with the thermal coefficient of expansion (TCE) of a test probe relative to that of a silicon wafer.

Another problem with full wafer-level probing of devices for testing and burn-in concerns the redistribution of signals from the device die pad pitch to the land pad array pitches which are presently attainable on printed wiring boards. Currently, it is not possible to build a printed wiring board that could accommodate full wafer-level device testing and burn-in in an economical and quick-turn manner.

A further problem with full wafer-level probing of semiconductor wafers for device testing and burn-in concerns the decoupling of thermal mismatch between the silicon wafer under test and the printed wiring board probe card.

Additionally, there is a problem with regard to compliance to overcome flatness tolerance of the printed wiring board surface.

It would be advantageous to provide a solution that allowed full wafer level probing of semiconductor wafers for purposes of device testing and burn-in while avoiding the various problems attendant with such probing, as described above. The solution can be adapted to allow a few steps across a wafer (two or four) to match the capabilities of testers currently in IC manufacturing lines until full wafer test capacity is put in place.

SUMMARY OF THE INVENTION

The invention provides a mosaic decal probe, in which a mosaic of probe chips is assembled as a decal onto a thin membrane that is suspended in a ring which is made of a material that has a TCE matching that of the devices on the wafer under test (silicon or III–V materials). The membrane is mounted on the ring in tension, such as it stays in tension throughout a functional temperature range. In this way, the membrane exhibits a functional TCE matching that of the ring. Each probe chip preferably has spring contacts on both sides. Apertures are cut in the membrane to allow the spring contacts on one side of the membrane to protrude through the membrane and contact the printed wiring board. The spring contacts which contact the printed wiring board are allowed to slide during temperature excursions, thereby decoupling the TCE mismatch between the probe chip and the printed wiring board.

Two preferred embodiments are currently contemplated. A first embodiment of the invention uses a low-count mosaic comprised of a few probe chips, for example four probe chips. The probe chips have the same TCE as the wafer under test, e.g. silicon. In this embodiment, the probe chip is peripherally attached to the membrane.

A second embodiment of the invention provides a high-count mosaic, using a high number of probe chips, for example nine or more probe chips. In this embodiment, the probe chips are smaller and can have a slight TCE difference from that of the test wafer, e.g. silicon. For example, the probe chips may be made out of a ceramic material. This embodiment of the invention uses a center attachment to secure the probe chips to the membrane.

BRIEF DESCRIPTION OF THE DRAWINGS

FIG. 4 is a plan view of a high-count mosaic starting wafer in which FIG. 4 shows a four inch ceramic wafer before being sawn, and FIG. 4-B shows the substrate after being sawn;

DETAILED DESCRIPTION OF THE INVENTION

Figure 1B:
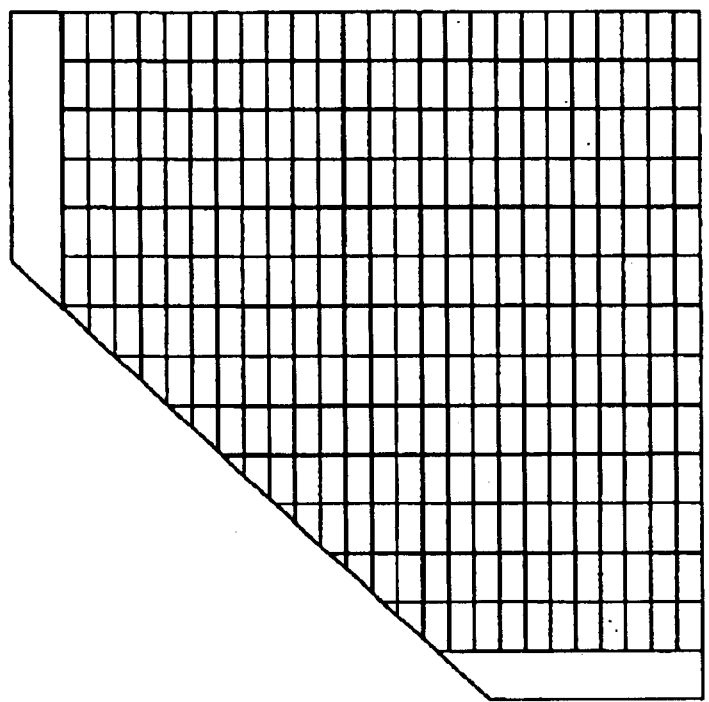
FIG. 1 is a plan view of a low-count mosaic starting substrate in which FIG. 1-A shows a 6.6 inch square silicon substrate before being sawn, and FIG. 1-B shows the substrate after sawing.

The invention provides a mosaic decal probe, in which a mosaic of probe chips is assembled as a decal into a thin membrane that is suspended in a ring, which is made of a material that has a TCE matching that of silicon. The membrane is mounted on the ring in tension, such as it stays in tension throughout a functional temperature range. In this way, the membrane exhibits a functional TCE matching that of the ring. Each probe chip preferably has spring contacts on both sides. Apertures are cut in the membrane to allow the spring contacts on one side of the membrane to protrude through the membrane and contact a printed wiring board. The spring contacts, which contact the printed wiring board are allowed to slide during temperature excursions, thereby decoupling the TCE mismatch between the probe chip and the printed wiring board.

One important function of the above-mentioned thin membrane and the ring is to facilitate maintenance of tight positional accuracy of the contact probe springs on the terminal contact pads on the integrated circuits (IC) of the wafer during temperature excursion. For example, if the TCE of the probe chip and ring materials is exactly or substantially the same as that of the wafer substrate, the relative movement of the probe springs and the IC terminal pads during temperature excursion is minimized. For semiconducting silicon IC-s, examples of such materials for the probe-chip and ring are silicon or glass-ceramics. Another example for the ring is molybdenum which being a metal cannot be used as probe chip material unless it is properly insulated for isolation. For other solid state devices, comprising semiconducting III–V compounds, II–IV compounds, arrays of surface acoustic wave devices, or arrays of display elements comprised of inorganic or organic materials, or arrays of micro-electromechanical (MEMS) devices, the probe chip and ring materials are similarly selected so that TCE of these materials are substantially similar to that of the device substrates.

The probe chip typically comprises a substrate with electrically conducting vias that connect pads and traces from one surface to the other surface. On the side contacting the wafer under test, contact springs are fabricated to match the contact pads on the wafer. Similarly, on the side facing the PWB, contact springs are fabricated to match the pad and associated plated through holes on the PWB. Interconnect traces comprising patterned metalization on one or both sides of the substrate provides redistribution of the signals so that the pitch of the spring contacts can be translated from the typically narrow die pad pitch to a wider one producible by standard PWB technology. The substrates may also have multi-layer metallization (more than two layers—one on each surface), similar to those currently used in the industry for high performance packaging.

Typically, in wafer level burn in and testing, a number of die sites share common input signals to reduce to total number of signals from the test system. To avoid a defective die site from shorting out a signal causing all the sites connected to the same signal to be untestable, a resistor is typically inserted in the trace to each input thus isolating it from the shared signal trace. This can be incorporated into the substrate, which leads to further simplification of the PWB. This can be fabricated by methods such as conventional thin or thick film deposition techniques on the substrate.

The present invention applies to various types of contact springs. For example, these springs include, but not limited to: (i) arrays of springs fabricated using integrated circuit fabrication techniques comprising thin films, photolithography patterning and selective etching; (ii) stress metal springs that are fabricated utilizing the inherent stress gradients present in a deposited film; (iii) discreet springs fabricated individually or as a group and subsequently mounted onto a substrate. For the stress metal springs, these films are deposited by conventional physical vapor deposition, chemical vapor deposition or electro-deposition techniques onto other films, which act as a release layer and an anchor layer. Typically the film is comprised of a plurality of layers with different stress levels that are introduced by varying the deposition parameters during sputtering or electroplating. Upon patterning the spring finger a portion of the finger (free portion of the spring) is released from the substrate by etching the release layer, resulting in lifting of spring fingers, which lift and extend away from the substrate forming a three dimensional structure, while the other portion (base of the spring) remains anchored to the substrate. The discreet springs are typically fabricated using wire bonding techniques that form and attach a core to a substrate which is subsequently coated with at least one film. Typically these coated core springs, composite springs, are subsequently mounted onto other substrates, which are used in probe card assemblies. Further details about these various types of springs are available in the cited references.

Two preferred embodiments are currently contemplated. A first embodiment of the invention uses a low-count mosaic comprised of a few probe chips, for example four probe chips. The probe chips have the same TCE as the wafer under test, e.g. silicon. In this embodiment, the probe chip is peripherally attached to the membrane.

A second embodiment of the invention provides a high-count mosaic, using a high number of probe chips, for example nine or more probe chips. In this embodiment, the probe chips are smaller and can have a slight TCE difference from that of the test wafer, e.g. silicon. For example, the probe chips may be made out of a ceramic material. This embodiment of the invention uses a center attachment to secure the probe chips to the membrane.

Other embodiments with different TCE matching characteristics and probe chip sizes could benefit from attaching at both the central and peripheral areas to the membrane.

Figure 1A:
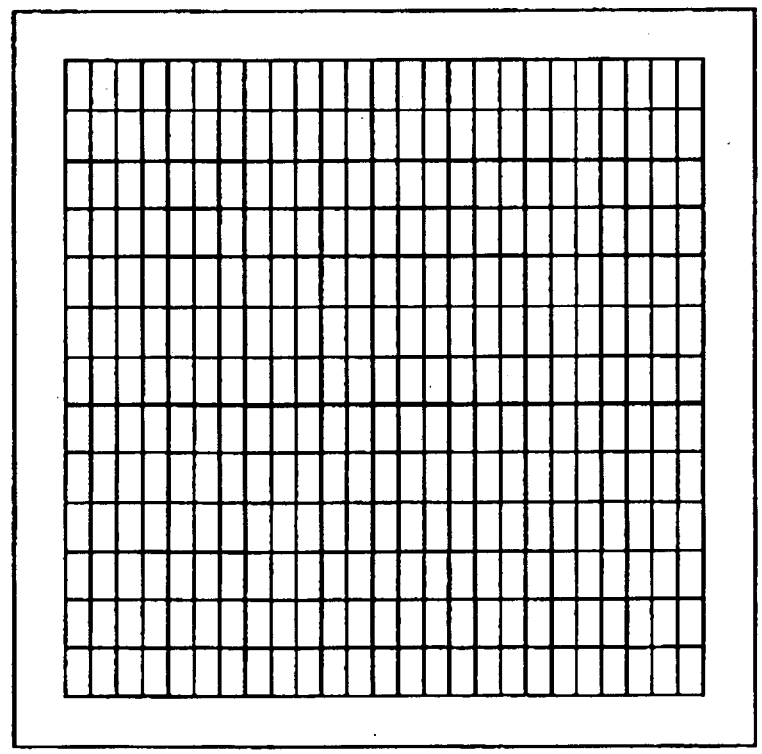

FIG. 1 shows a low-count mosaic starting substrate according to the invention. Such substrate is fabricated using known techniques to provide an array of die site regions, each having contacts formed on a first surface thereof that are complementary to the die pads of devices to be tested and/or burned in on a test wafer. Contacts are also formed on a second, opposite surface of the die site regions and arranged to contact a printed wiring board. The contacts on each surface of each of the die site regions are configured such that at least one contact on the first side of each die is electrically connected to at least one contact on the other surface of the die. Various types of contacts are known that are suitable for use in connection with the invention disclosed herein. See, for example, Massively Parallel Interface for Electronic Circuits, U.S. patent application Ser. No. 09/979,551 filed Nov. 20, 2001; Construction Structures and Manufacturing Processes for Integrated Circuit Wafer Probe Card Assemblies, U.S. patent application Ser. No. 09/980,040 filed Nov. 27, 2001; Construction Structures and Manufacturing Processes for Integrated Circuit Wafer Probe Card Assemblies, U.S. patent application Ser. No. 10/094,370 filed Mar. 8, 2002; and Systems for Testing and Packaging Integrated Circuits, U.S. patent application Ser. No. 10/069,902 filed Feb. 20, 2002.

In FIG. 1-A, a 6.6 inch square silicon substrate is shown prior to being sawn. While a 6.6 inch substrate is shown for purposes of the invention as discussed herein, those skilled in the art will appreciate that other sizes of substrates may be used in connection with the invention. The advantage of this size is the availability of substrates and suitable processing equipment while the resulting active area can cover one quarter of a 300 mm wafer.

FIG. 1-B shows the substrate of FIG. 1-A after being sawn.

Figure 2B:
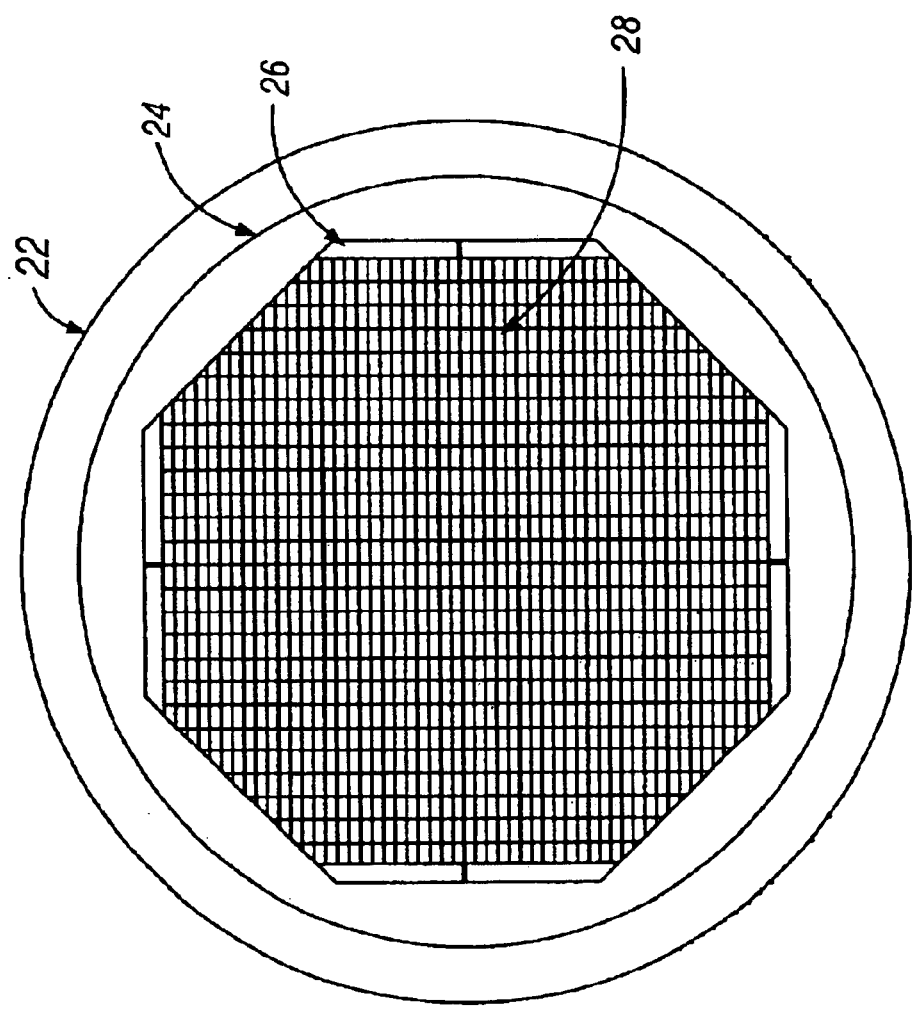
FIG. 2 shows an assembled mosaic in which FIG. 2-A is a side view of the assembled mosaic, and FIG. 2-B is a plan view of the assembled mosaic.
Figure 2A:
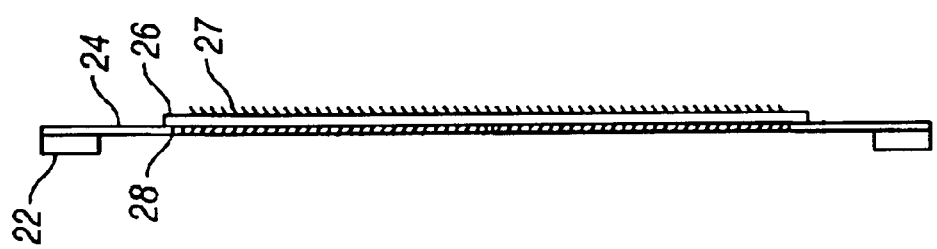

FIG. 2 shows an assembled mosaic according to the invention. FIG. 2-A is a side view of the assembled mosaic showing a ring 22 which, in this embodiment, is made of molybdenum, a membrane 24 which, in this embodiment, is a one mil polyimide film that is stretched across the ring 22 and secured thereto using conventional techniques, such as bonding or by the use of any of various adhesives, and a plurality of sawed probe chip substrates 26, arranged as a mosaic and affixed to the membrane as a decal. The arrangement of the sawed probe chips is best seen in FIG. 2-B, which has superimposed thereon an outline of a 12-inch wafer. In this embodiment of the invention, four probe chip substrates are assembled and mounted to the polyimide film to produce an array of test structures that is sufficient to test a 300-mm wafer. It can further be seen in FIG. 2-A that the probe chips have springs 27, 28, on each side to allow the probe chips to contact devices on the wafer under test, as well as to contact a printed wiring board. Those skilled in the art will appreciate that this embodiment of the invention is readily applied to test wafers of various sizes and that the actual number, shape, and arrangement of probe chips is a matter of choice, based upon the application to which the invention is put.

Figure 3:
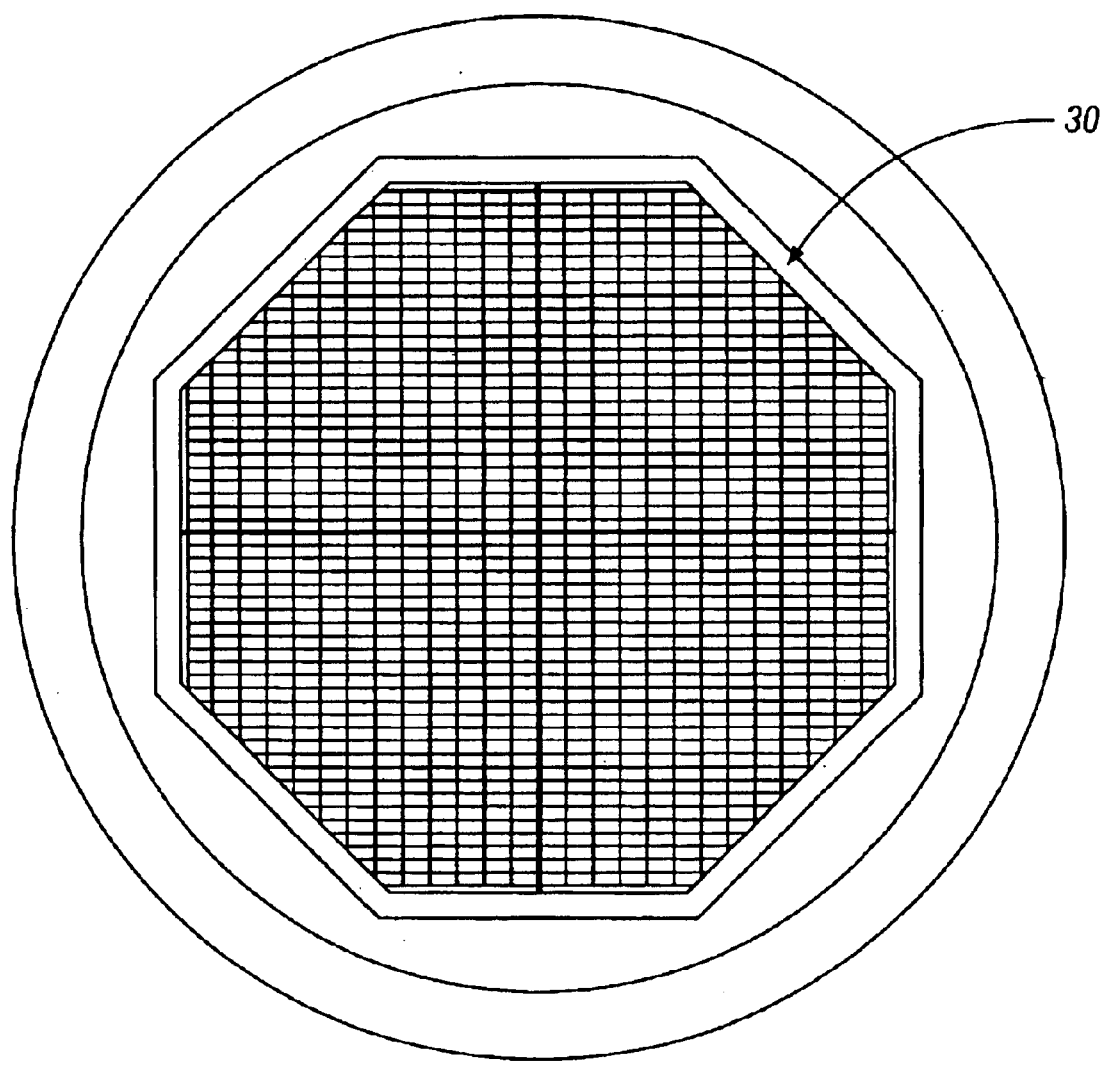
FIG. 3 is a plan view of assembled mosaic showing adhesive regions for securing the probe chips to the substrate backside according to the invention.

FIG. 3 is a plan view of an assembled mosaic showing adhesive regions between the probe chip substrate backside and the polyimide membrane. Those skilled in the art will appreciate that any appropriate adhesive may be used to bond the probe chips to the membrane. For purposes of the presently preferred embodiment, such adhesives as B-stage epoxy film can be used. The adhesive is preferably applied as shown, along the outside edge of the probe chips, to hold the probe chips together in a substantially unitary configuration. The membrane and probe chips are then laminated by applying pressure to bond and cure the assembly, or by use of other appropriate means as are known in the art. Thereafter, the region behind the probe chip that is not bonded is cut away to expose the spring contacts, which are used to probe the printed wiring board.

In other embodiments, the membrane may be pre-cut such that the contacts are exposed upon initial assembly of the probe chips and the membrane. In the presently preferred environment of the invention, the spring contacts that are exposed by cutting away the membrane are those which contact the printed wiring board, although in other embodiments of the invention the spring contacts which contact the wafer under test could be exposed by cutting away the membrane appropriately. The membrane itself may be made of a film, such as a polyimide or other material, for example, such as Kapton manufactured by DuPont. Other examples of the membrane are given in co-pending application CONSTRUCTION STRUCTURES AND MANUFACTURING PROCESSES FOR PROBE CARD ASSEMBLIES AND PACKAGES HAVING WAFER LEVEL SPRINGS, U.S. patent application Ser. No. Unassigned, filed Jun. 24, 2002. These include, but not limited to, flexible and compliant sheet, mesh or screen.

FIG. 3 shows a low-count mosaic according to a first embodiment of the invention. This embodiment of the invention uses fewer probe chips, for example as shown in FIG. 3 there are four probe chips used. In this embodiment, the probe chips have the same TCE as the wafer under test, e.g. silicon, and the ring material, e.g. molybdenum, has substantially similar TCE as silicon. The probe chips are attached to the membrane using adhesive applied to the periphery of the probe chips. When temperature conditions change, the ring to which the membrane is attached expands and contracts in the same fashion as the wafer being tested. In this case, the ring stretches or un-stretches the membrane and thereby allows the probe chips to expand and contract in such fashion that their movement substantially matches that of the wafer being tested. Because the probe chips have the same TCE as silicon, the actual geometry of the probe chips and the wafer under test do not change.

Additionally, the spring contacts on the probe chip which are used to contact the printed wiring board provides a sliding contact, such that stretching of the film as a result of expansion and contraction of the ring which results in moving of the probe chips does not interrupt a connection between the spring contacts and the printed wiring board. Thus, the spring contacts slide across the interconnect pads of the printed wiring board as the probe chips expand and contract due to change in temperature, and yet they remain in electrical contact with the printed wiring board. The use of spring contacts also addresses any lack of planarity in the printed wiring board.

Figure 4B:
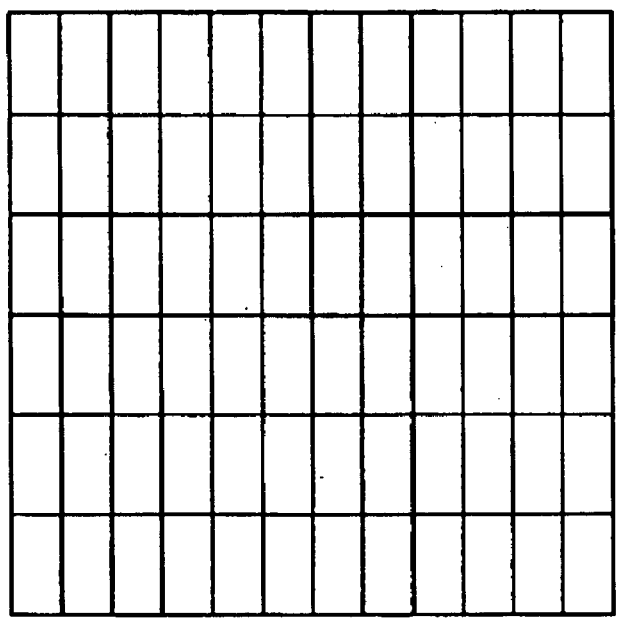
Figure 4A:
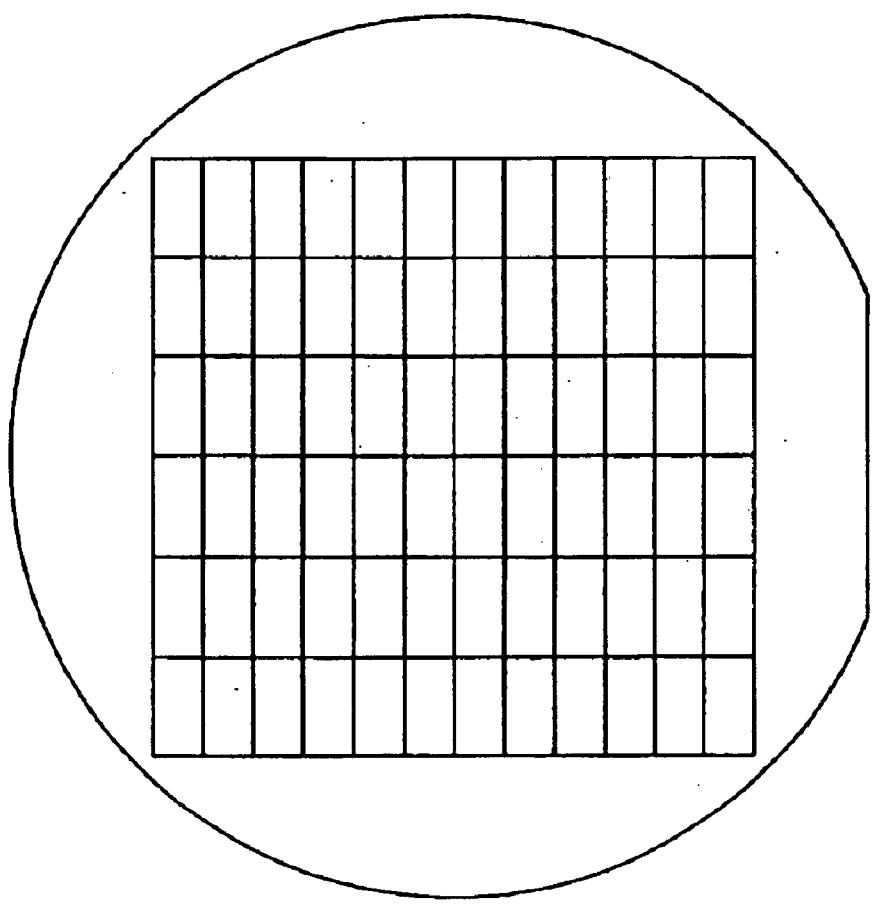

FIG. 4 is a plan view of a high-count mosaic starting wafer, showing a four-inch ceramic wafer in FIG. 4-A and the sawed substrate in FIG. 4-B. The high-count mosaic uses a higher number of probe chips than the low-count mosaic. For example, the preferred embodiment may use nine or more probe chips. In such case, the probe chips are smaller and therefore can have a slight TCE difference from that of silicon. Accordingly, a probe chip in this embodiment of the invention may be made of materials such as ceramic or other materials.

Figure 5:
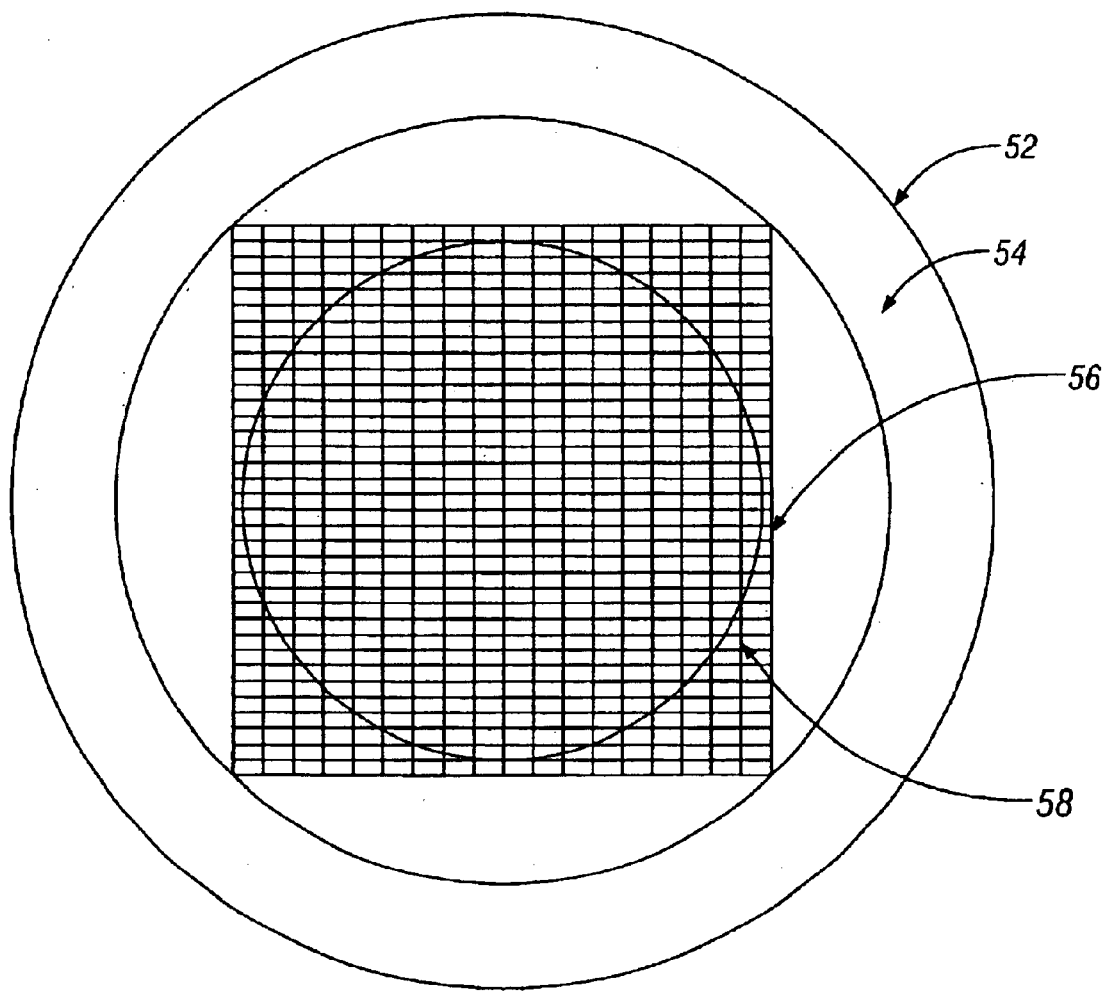
FIG. 5 is a plan view of an assembled high-count mosaic, according to the invention.

FIG. 5 shows an assembled high-count mosaic in which a ring 52 has stretched there across a film 54 to which the sawed probe chip substrates 56 are attached. The outline of an 200-mm wafer 58 is shown, indicating that the wafer is substantially covered by the probe chip mosaic. Those skilled in the art will appreciate that while the embodiment of the invention herein is shown in connection with 200- and 300-mm wafers, the invention is applicable to wafers of other sizes as well. Further, while various arrangements of decals are shown to establish a mosaic, those skilled in the art will appreciate that any number and shape of probe chips may be assembled, as long as a sufficient number are assembled to cover that portion of the wafer to be tested.

Figure 6:
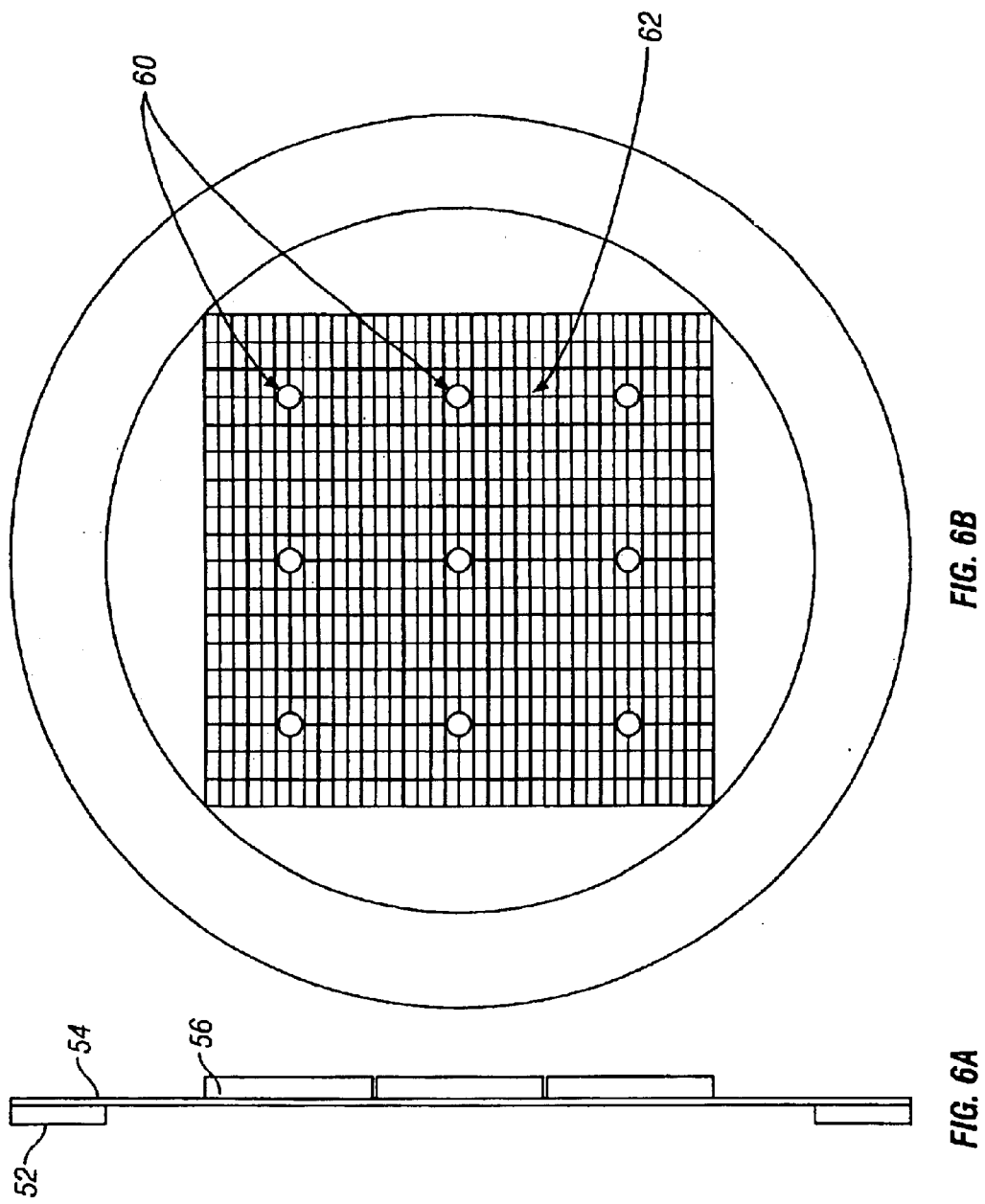
FIG. 6 shows the adhesive regions of a high-count mosaic according to the invention in which FIG. 6-A is a side view of the mosaic, and FIG. 6-B is the plan view of the mosaic.

FIG. 6 is a view of the assembled high-count mosaic showing adhesive regions. In FIG. 6-A, a side view of the assembled mosaic is shown. FIG. 6-B shows the location of adhesive spots 60 which are used to secure the probe chips 56 to the membrane 54. As can be seen, the membrane has a matrix of apertures 62 that match the backside spring contacts of the probe chips. The adhesive can be dispensed over small apertures in the membrane so that there is no bond line thickness between the membrane and the probe chip. This decreases the height that the backside springs have to reach.

Figure 7:
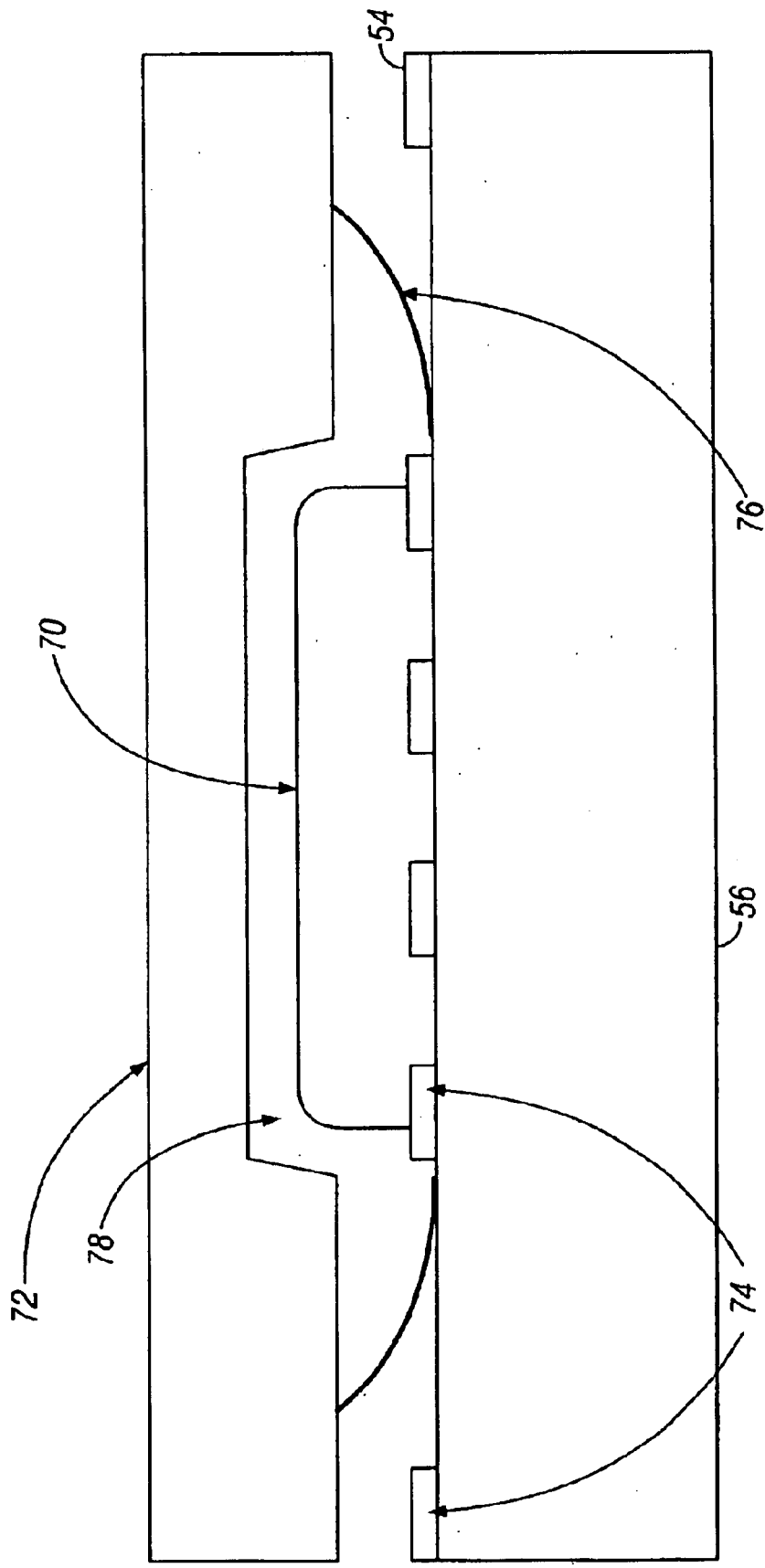
FIG. 7 is a schematic side view of a mosaic showing adhesive dot details according to the invention.

FIG. 7 is a schematic side view of a high-count mosaic showing the details of the adhesive dot. In FIG. 7, a probe chip 56 is shown secured to the membrane 54. Apertures 74 are defined by the patterning 74 of the membrane. An adhesive dot 70 is shown applied to one side of the probe chip 56. A printed wiring board 72 is shown having a profiled, e.g. milled, area 78 that matches the profile of the adhesive dot. The printed wiring board is shown having a plurality of backside spring contacts 76 which extend from the probe chip into contact with the surface thereof. It can be seen from FIG. 7 that movement of the printed wiring board relative to the probe chip results in a sliding action of the spring contacts along the surface of the printed wiring board, which assures maintenance of an electrical connection there between during expansion and contraction which results from variations in temperatures within the processing environment.

For both the low count and high count embodiments, the thickness of the membrane plus adhesive adds to the height of the spring needed to make contact through the openings in the membrane. This can be mitigated by milling a recess in the PWB in regions matching the membrane to allow the membrane and adhesive to protrude into the PWB.

Figure 8:
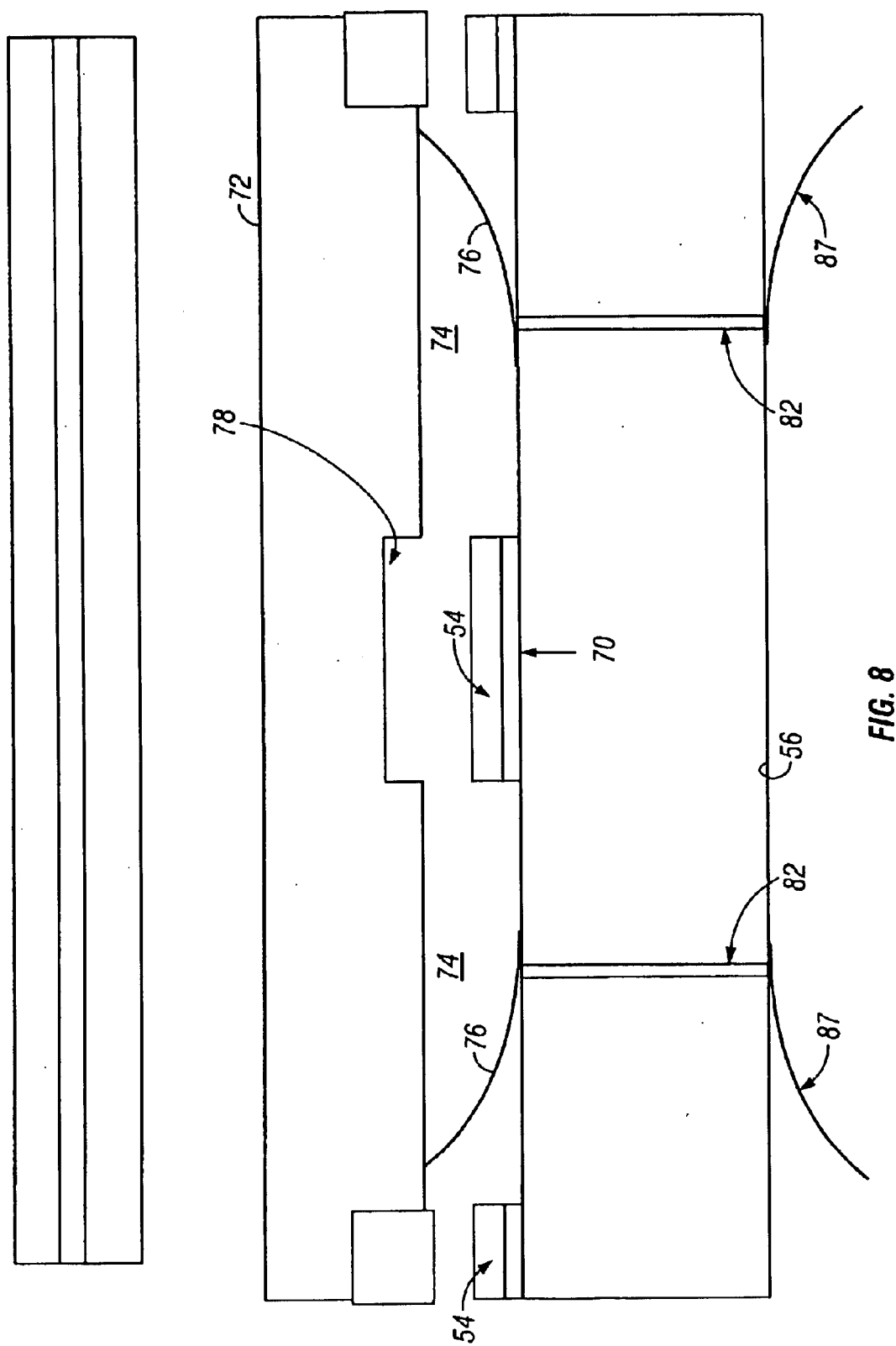
FIG. 8 is a schematic side view of a mosaic showing details of centrally placed adhesive between the membrane and the probe chip according to the invention.
Figure 9:
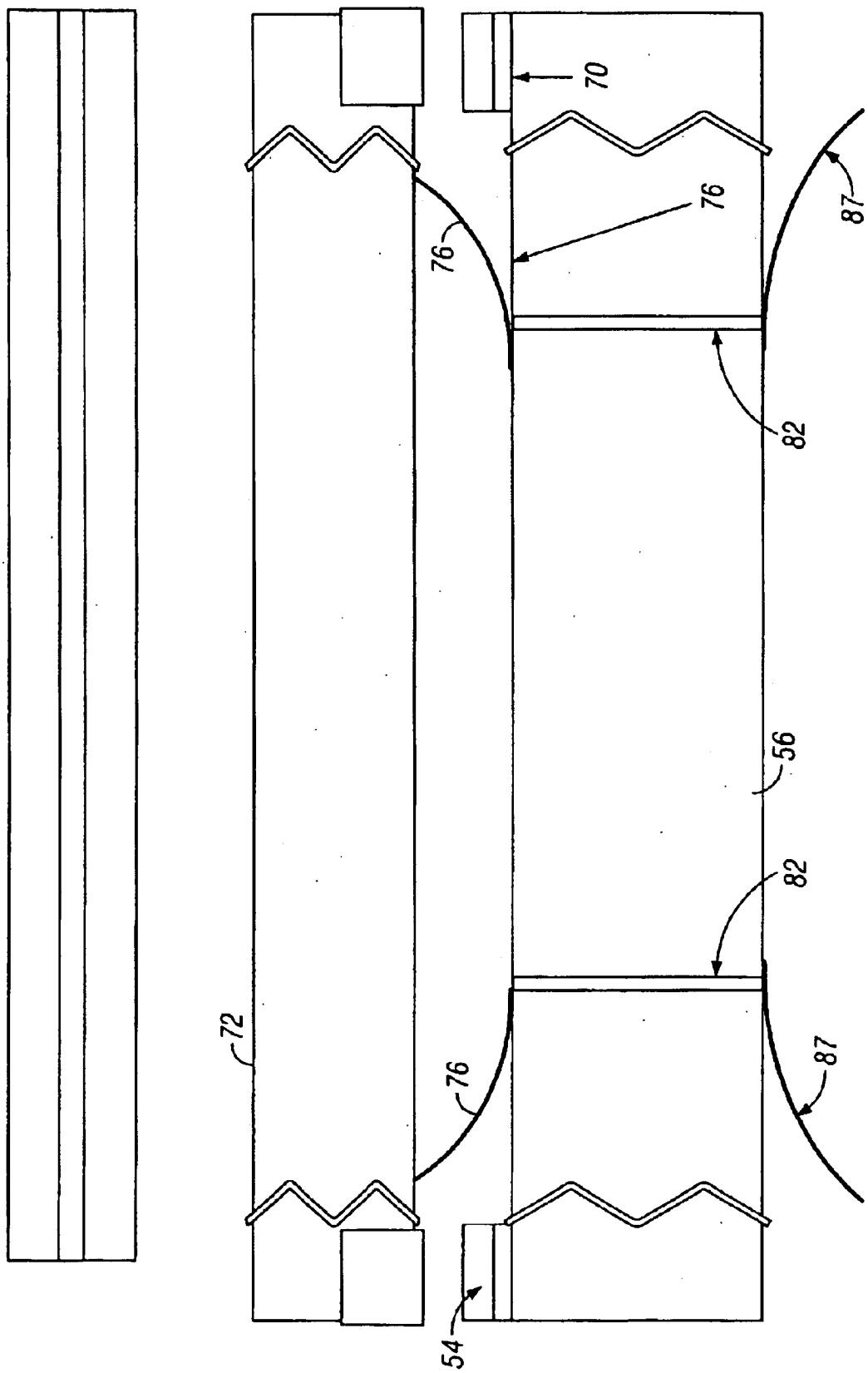
FIG. 9 is a schematic side view of a mosaic showing details of peripherally placed adhesive between the membrane and the probe chip according to the invention.

FIGS. 8 and 9 schematically show two other embodiments for mounting probe chips to the membrane. In both cases the adhesive is placed in between the probe chip and the membrane. In FIG. 8, the probe chip is centrally attached, whereas in FIG. 9 the probe chip is peripherally attached to the membrane. In both cases, the attachment is preferably made on the probe chip surface facing the PWB. Recesses are made on the PWB to accommodate the projected membrane and adhesive region, so that the backside contact springs can be relatively short in length for making effective electrical contact to the interconnect pads of the PWB. Also shown in FIGS. 8 and 9 are a plurality of front side spring contact 81 which, in this embodiment, are electronically connected to respective backside spring contacts by electronically conductive vias 82.

The thickness of the adhesive and depth of the milling can be adjusted to provide a stop or stand-off to prevent the spring from bottoming out on the pad. A stand-off on the side of the wafer side of the probe chip can be used to keep the probe from bottoming out on the IC wafer (see, for example, CONSTRUCTION STRUCTURES AND MANUFACTURING PROCESSES FOR PROBE CARD ASSEMBLIES AND PACKAGES HAVING WAFER LEVEL SPRINGS, U.S. patent application Ser. No. Unassigned, filed Jun. 24, 2002.

Although the invention is described herein with reference to the preferred embodiment, one skilled in the art will readily appreciate that other applications may be substituted for those set forth herein without departing from the spirit and scope of the present invention. Accordingly, the invention should only be limited by the claims included below.

What is claimed is:

1. A probe of water-level testing and/or of electronic components, comprising:
   a mosaic comprising a plurality of probe chips;
   a membrane onto which said mosaic of probe chips is affixed;
   a ring from which said membrane is suspended, and by which said membrane is optionally held in tension, said ring being made of a material that has a thermal coefficient of expansion (TCE) substantially matching that of said wafer;
   wherein a plurality of spring contacts formed on at least one surface of each of said probe chips comprise a fixed portion attached to said probe chip surface and a free portion, said free portion being initially attached to said probe chip surface and, upon release, said free portion extending away from said probe chip surface as a result of an inherent stress gradient in said spring contact.

2. The probe of claim 1, wherein said plurality of spring contacts each comprise a plurality of layers, and wherein said free portions of said spring contacts extend away upon release from said probe chip surface as a result of said inherent stress gradient defined between said plurality of layers.

3. The probe of claim 1, wherein the plurality of spring contacts are any of:
   formed by sputtering;
   formed by electroplating;
   formed as photolithographically patterned springs, in which the free portions define a three-dimensional structure; and
   formed individually or en masse and subsequently mounted to probe chips.

4. The probe of claim 1, wherein said spring contacts are alternatively comprised of a composite structure comprising a core section covered with at least one overlying film;
   wherein said core is optionally made using a wire bonding technique.

5. The claim of 4, wherein said at least one overlying film is an electro-deposited film.

6. A probe method for wafer-level testing and/or burn-in of electronic components, comprising in any sequence the steps of:
   providing a mosaic comprising a plurality of probe chips;
   affixing said mosaic of probe chips onto a membrane;
   suspending said membrane from a ring, said ring being made of a material that has a thermal coefficient of expansion (TCE) substantially matching that of said wafer;
   wherein a plurality of spring contacts formed on at least one surface of each of said probe chips comprise a fixed portion attached to said probe chip surface and a free portion, said free portion being initially attached to said probe chip surface and, upon release, extending away from said probe chip surface as a result of an inherent stress gradient in said spring contact.

7. The method of claim 6, wherein said plurality of spring contacts each comprise a plurality of layers, and wherein said free portions of said spring contacts extend away upon release from said probe chip surface as a result of said inherent stress gradient defined between said plurality of layers.

8. The method of claim 6, wherein the plurality of spring contacts are any of:
   formed by sputtering;
   formed by electroplating;
   formed as photolithographically patterned springs, in which the free portions define a three-dimensional structure; and
   formed individually or en masse and subsequently mounted to probe chips.

9. The method of claim 6, wherein said spring contacts are alternatively comprised of a composite structure comprising a core section covered with at least one overlying film;
   wherein said core is optionally made using a wire bonding technique.

10. The method of 9, wherein said at least one overlying film is an electro-deposited film.

* * * * *

UNITED STATES PATENT AND TRADEMARK OFFICE
CERTIFICATE OF CORRECTION

PATENT NO. : 6,710,609 B2
DATED : March 23, 2004
INVENTOR(S) : Mok et al.

It is certified that error appears in the above-identified patent and that said Letters Patent is hereby corrected as shown below:

<u>Column 7,</u>
Line 31, replace "A probe of water-level testing and/or of electronic components, comprising:" with
-- 1. A probe for wafer-level testing and/or burn-in of electronic components, comprising: --.

Signed and Sealed this

Eighteenth Day of October, 2005

JON W. DUDAS
*Director of the United States Patent and Trademark Office*